United States Patent
Nakayama et al.

(10) Patent No.: US 6,853,235 B2
(45) Date of Patent: Feb. 8, 2005

(54) HIGH FREQUENCY SWITCH, AMPLIFYING CIRCUIT, AND MOBILE COMMUNICATION TERMINAL

(75) Inventors: Masao Nakayama, Ritto (JP); Masahiko Inamori, Ibaraki (JP); Takashi Yamamoto, Takatsuki (JP); Kaname Motoyoshi, Nishinomiya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/413,552

(22) Filed: Apr. 15, 2003

(65) Prior Publication Data

US 2003/0201826 A1 Oct. 30, 2003

(30) Foreign Application Priority Data

Apr. 26, 2002 (JP) ........................... 2002-125288

(51) Int. Cl.$^7$ .............................................. H03K 17/16
(52) U.S. Cl. .................... 327/379; 327/419; 327/427; 333/101
(58) Field of Search ................... 327/379, 389, 327/391, 401, 403, 404, 415, 416, 419, 427, 434, 436, 437; 333/100, 101, 103, 81 R

(56) References Cited

U.S. PATENT DOCUMENTS

| | | | | |
|---|---|---|---|---|
| 5,818,099 A | * | 10/1998 | Burghartz | 257/548 |
| 5,883,541 A | * | 3/1999 | Tahara et al. | 327/434 |
| 5,903,178 A | | 5/1999 | Miyatsuji et al. | 327/308 |

FOREIGN PATENT DOCUMENTS

| | | |
|---|---|---|
| EP | 1164719 A1 | 12/2001 |
| JP | 09181588 | 7/1997 |
| JP | 10150362 | 6/1998 |
| JP | 2001 217653 | 8/2001 |

OTHER PUBLICATIONS

K. Miyatsuji, et al.; "A GaAs Single Voltage Controlled RF Switch IC," IEICE Transactions on Electronics, Institute of Electronics Information and Comm, Eng. Tokyo, JP, vol. E78–C, NR. 8, pp. 931–935, XP000536071, ISSN: 0916–8524, Aug. 8, 1995.

* cited by examiner

*Primary Examiner*—Timothy P. Callahan
*Assistant Examiner*—An T. Luu
(74) *Attorney, Agent, or Firm*—Stevens, Davis, Miller & Mosher, LLP

(57) ABSTRACT

In order to provide a high frequency switch in which the setting range of the control voltage is expanded, the high frequency switch is constructed from a switch and a reference voltage generation circuit. The switch comprises first and second field effect transistors. In the first field effect transistor, the source electrode is connected to a signal input terminal, while the drain electrode is connected to a signal output terminal, and while the source electrode is connected to a control terminal. In the second field effect transistor, the source electrode is connected to the signal input terminal, while the drain electrode is connected to the signal output terminal, and while the gate electrode is connected to the control terminal. The reference voltage generation circuit generates two reference voltages the values of which are different from each other, then provides the lower reference voltage to the gate electrode of the first field effect transistor, and then provides the higher reference voltage to the source electrode of the second field effect transistor.

14 Claims, 11 Drawing Sheets

HIGH FREQUENCY SWITCH, AMPLIFYING CIRCUIT, AND MOBILE COMMUNICATION TERMINAL

BACKGROUND OF THE INVENTION

1. Field of the Invention

The present invention relates to a high frequency switch provided in a high frequency circuit section of a transmitting section of a mobile communication terminal such as a portable telephone terminal and used for switching the signal path of a high frequency signal.

The invention further relates to an amplifying circuit for switching the signal path of a high frequency signal and, at the same time, amplifying the high frequency signal.

The invention further relates to a mobile communication terminal provided with the high frequency switch or the amplifying circuit mentioned above.

In particular, the invention relates to a high frequency switch and an amplifying circuit for switching the signal path of a high frequency signal in response to a control voltage.

2. Description of the Related Art

A recent major trend in the field of mobile communication is that a plurality of communication schemes are integrated in an integrated portable telephone terminal. An example of this is a portable telephone terminal which supports both W-CDMA (wide band code division multiple access) scheme and PDC (personal digital cellular) scheme. Such an integrated portable telephone terminal provides the advantages of both schemes, such as a high data communication speed obtained in W-CDMA scheme and a wide service area available in PDC scheme, and is thereby expected to spread rapidly in the future.

Nevertheless, the frequency used as the carrier wave is different in W-CDMA scheme and in PDC scheme. Thus, two separate sub-blocks for W-CDMA scheme and PDC scheme need to be provided in the high frequency circuit block. Further, in order to reduce the size of the mobile communication terminal and the operation current of the high frequency circuit block, the design of the high frequency circuit block becomes more important.

Described below is a typical prior art portable telephone terminal which supports a plurality of communication schemes such as PDC and W-CDMA.

FIG. 4 is a block diagram showing the configuration of a radio section of a typical prior art portable telephone terminal. In FIG. 4, the radio section of the portable telephone terminal comprises a transmitting section 200, a receiving section 300, a synthesizer section 400, and a shared device section 500.

The transmitting section 200 comprises: an up converter 201 for converting a modulated signal input (intermediate frequency modulated signal) having an intermediate frequency (such as 600 MHz) into a signal having a transmission frequency (approximately 900 MHz in PDC scheme and approximately 1.9 GHz in W-CDMA scheme); a variable gain high frequency amplifier circuit 202 for amplifying the output signal (1 mW or lower) of the up converter 201 into 10 mW or the like at maximum; a high frequency switch 203 for switching a band pass filter to be used, depending on the transmission frequency; a band pass filter 204 and a band pass filter 207 for extracting a signal in the transmission wave band; a fixed gain high power high frequency amplifier circuit 205 for amplifying the high frequency signal (10 mW or lower) outputted from the band pass filter 204 into 1 W or the like at maximum; an isolator 206 for providing the output of the high power high frequency amplifier circuit 205 to the shared device section 500 for transmitting the output as a radio wave; a fixed gain high power high frequency amplifier circuit 208 for amplifying the high frequency signal (10 mW or lower) outputted from the band pass filter 207 into 1 W or the like at maximum; an isolator 209 for providing the output of the high power high frequency amplifier circuit 208 to the shared device section 500 for transmitting the output as a radio wave.

The receiving section 300 comprises: a front end IC 301 for performing the high frequency amplification of a reception signal received by the shared device section 500 and then mixing this reception signal with a local oscillation signal provided from the synthesizer section 400; and a band pass filter 302 for extracting an intermediate frequency signal from the output signal of the front end IC 301.

The synthesizer section 400 comprises a temperature controlled quartz oscillator (TCXO) 401, a phase locked loop (PLL) circuit 402, and a voltage controlled oscillator (VCO) 403.

The shared device section 500 comprises an antenna 501, an antenna 502, and a duplexer 503.

In order that a plurality of communication schemes such as PDC and W-CDMA are supported and that the size of the high frequency circuit block is still reduced in the mobile communication terminal, the up converter 201 and the high frequency amplifier circuit 202 are shared for both communication schemes in this radio section. In contrast, the band pass filters 204 and 207, the high power high frequency amplifier circuits 205 and 208, and isolators 206 and 209 are arranged in separate circuit sub-blocks necessary for the respective communication frequencies. This causes the necessity of the high frequency switch 203 for selecting the circuit sub-block depending on the communication frequency.

FIG. 5 is a block diagram showing the configuration of a radio section of another prior art portable telephone terminal. In FIG. 5, a signal input terminal 101 receives an intermediate frequency modulated signal generated by the modulation of voice and the like. An up converter 103 receives the intermediate frequency modulated signal from the signal input terminal 101 and a local oscillation signal from an oscillator 102. The up converter 103 then converts the intermediate frequency into a transmission frequency. More specifically, the up converter 103 mixes the signal (intermediate frequency modulated signal) having the intermediate frequency with the local oscillation signal from the oscillator 102, and thereby converts the intermediate frequency into the transmission frequency.

Here, the frequency of the intermediate frequency modulated signal inputted to the up converter 103 is denoted by fif. The local oscillation frequency of the oscillator 102 is denoted by flo. The frequency of the transmission signal is denoted by fc. At this time, the relation $$fc = flo \pm fif$$

holds among the frequency of the transmission signal, the frequency of the intermediate frequency modulated signal, and the local oscillation frequency. Thus, the up converter 103 outputs a transmission signal having a frequency of fc. Examples of the intermediate frequency and the transmission signal frequency are described above. When the oscillation frequency of the oscillator 102 is changed, transmission waves corresponding to a plurality of transmission frequencies, such as those used in PDC scheme and W-CDMA scheme, can be synthesized.

A high frequency amplifier circuit 104 is provided with the function of gain control, and thereby amplifies a signal having the transmission frequency into 10 mW or the like at maximum. A high frequency switch 105 selects a high frequency circuit corresponding to the communication frequency.

In the present example, the high frequency circuit composed of a band pass filter 106, a high power high frequency amplifier circuit 107, and an isolator 108 is defined as that used in PDC scheme. The high frequency circuit composed of a band pass filter 109, a high power high frequency amplifier circuit 110, and an isolator 111 is defined as that used in W-CDMA scheme.

In PDC scheme, the output signal of the high frequency amplifier circuit 104 is outputted from a terminal 105a to a terminal 105b of the high frequency switch 105, and thereby provided to the band pass filter 106. The band pass filter 106 extracts solely a signal in the transmission wave band from the inputted signal, and then outputs the signal. The high power high frequency amplifier circuit 107 amplifies the output signal (the signal having the transmission frequency) of the band pass filter 106 into 1 W or the like at maximum. The output of the high power high frequency amplifier circuit 107 is provided through the isolator 108 to a terminal 112a of a duplexer 112.

In W-CDMA scheme, the output signal of the high frequency amplifier circuit 104 is outputted from the terminal 105a to a terminal 105c of the high frequency switch 105, and thereby provided to the band pass filter 109. The band pass filter 109 extracts solely a signal in the transmission wave band from the inputted signal, and then outputs the signal. The high power high frequency amplifier circuit 110 amplifies the output signal (the signal having the transmission frequency) of the band pass filter 109 into 1 W or the like at maximum. The output of the high power high frequency amplifier circuit 110 is provided through the isolator 111 to a terminal 112b of the duplexer 112.

The duplexer 112 transfers the transmission signal outputted from the isolator 108 to the antenna 113, transfers the reception signal received by the antenna 113 to a signal output terminal 115, transfers the transmission signal outputted from the isolator 111 to the antenna 114, transfers the reception signal received by the antenna 114 to a signal output terminal 116.

In the high frequency circuit block of FIG. 5, the antenna 113 or 114 is selectively used depending on the communication scheme. The antenna 113 is used for PDC scheme, while the antenna 114 is used for W-CDMA scheme. More specifically, the duplexer 112 has the following function. That is, the signal from the terminal 112a is transmitted to the terminal 112c, whereas the signal from the terminal 112a is blocked to the other terminals. The signal from the terminal 112b is transmitted to the terminal 112d, whereas the signal from the terminal 112b is blocked to the other terminals. The signal from the terminal 112c is transmitted to the terminal 112e, whereas the signal from the terminal 112c is blocked to the other terminals. The signal from the terminal 112d is transmitted to the terminal 112f, whereas the signal from the terminal 112d is blocked to the other terminals. Further, the signals from the terminal 112e and the terminal 112f are blocked to the other terminals.

In the configuration of FIG. 5, the high frequency switch 105 has selected the high frequency circuit, whereby the size of the high frequency circuit block has been reduced in the mobile communication terminal such as a portable telephone terminal supporting a plurality of communication schemes. In order that the size of the high frequency circuit block is further reduced in the mobile communication terminal, the circuit block having been constructed from discrete elements such as the high frequency amplifier circuit and the high frequency switch needs to be integrated.

Described below is a high frequency switch used in a high frequency circuit block of a mobile communication terminal.

In a high frequency switch used in a high frequency circuit block, a MES FET has been used so that the ON resistance and the OFF resistance of the FET has implemented the switching function. In general, a MES FET is a depression type FET, and has a negative threshold voltage. When a high frequency switch is constructed from a MES FET, the source electrode and the drain electrode of the FET are used as two signal electrodes, while the gate electrode of the FET is used as a control electrode. When the source electrode and the drain electrode of the FET are set at 0 V, in order that the FET goes ON, the gate electrode can be set at 0 V. In order that the FET goes OFF, the gate electrode can be set at a voltage lower than the threshold.

FIG. 6 shows an SPDT (single pole dual through) switch circuit using FETS, which serves as a high frequency switch. In the SPDT switch circuit of FIG. 6, the source electrode of a field effect transistor 131 serving as a switching element is connected through a capacitor 151 to a signal input terminal 125, while the drain electrode of the field effect transistor 131 is connected through a capacitor 152 to a signal output terminal 127. Further, the source electrode of a field effect transistor 132 serving as a switching element is connected through a capacitor 153 to the signal input terminal 125, while the drain electrode of the field effect transistor 132 is connected through a capacitor 154 to a signal output terminal 128.

The source electrode of the field effect transistor 131 is connected through a resistor 141 to a control terminal 124. The gate electrode of the field effect transistor 132 is connected through a resistor 142 to the control terminal 124.

The source electrode and the drain electrode of the field effect transistor 131 are interconnected through a resistor 146, and thereby maintained at the same potential. The source electrode and the drain electrode of the field effect transistor 132 are interconnected through a resistor 147, and thereby maintained at the same potential.

A serial circuit of resistors 143 and 144 is connected between a power supply terminal 121 and a ground terminal 122, whereby the connection point between the resistors 143 and 144 serves as a reference voltage terminal 123. The gate electrode of the field effect transistor 131 is connected through a resistor 145 to the reference voltage terminal 123. The source electrode of the field effect transistor 132 is connected directly to the reference voltage terminal 123.

A reference voltage generation circuit is constructed from the resistors 143 and 144 connected between the power supply terminal 121 and the ground terminal 122. Capacitors 151–154 are inserted for eliminating DC components. The resistors 141, 142, 145, 146 and 147 have high resistance values. The control terminal 124 is used for controlling the operation state of the switch circuit.

The circuit of resistors 143 and 144 constituting the reference voltage generation circuit have the same resistance value. Thus, when a power supply voltage Vdd is provided to the reference voltage generation circuit, the voltage Vref outputted from the reference voltage terminal 123 equals to Vdd/2.

For example, in FIG. 6, when the power supply voltage Vdd provided to the power supply terminal 121 is 3 V, and when the ground terminal 122 is grounded, the reference voltage Vref generated in the reference voltage terminal 123 by the reference voltage generation circuit equals to 1.5 V. In this case, when the control voltage Vc provided to the control terminal 124 is 0 V, the drain electrode and the source electrode of the field effect transistor 131 serving as a switching element are provided with a voltage of 0 V, while the gate electrode thereof is provided with a voltage of 1.5 V. Further, the drain electrode and the source electrode of the field effect transistor 132 serving as a switching element are provided with a voltage of 1.5 V, while the gate electrode thereof is provided with a voltage of 0 V.

The threshold voltages Vth of the field effect transistors 131 and 132 are assumed to be −0.7 V. In the field effect transistor 131, the gate electrode is at a potential exceeding 0 V which is higher than those of the source electrode and the drain electrode. This results in a low impedance between the source electrode and the drain electrode of the field effect transistor 131. Thus, the field effect transistor 131 is ON. In contrast, in the field effect transistor 132, the gate electrode is at a potential lower than the potential lower than those of the source electrode and the drain electrode by the threshold voltage Vth of the field effect transistor 132. This results in a high impedance between the source electrode and the drain electrode of the field effect transistor 132. Thus, the field effect transistor 132 is OFF.

In this state, when a high frequency signal is inputted through the signal input terminal 125, the high frequency signal is transmitted through the field effect transistor 131 having a low impedance, and then outputted through the signal output terminal 127. Further, the high frequency signal inputted through the signal input terminal 125 is blocked by the field effect transistor 132 having a high impedance, and hence not outputted through the signal output terminal 128. As a result, the high frequency signal inputted through the signal input terminal 125 is outputted from the signal output terminal 127.

Next, in FIG. 6, when the power supply voltage Vdd provided to the power supply terminal 121 is 3 V, and when the ground terminal 122 is grounded, the reference voltage Vref generated in the reference voltage terminal 123 by the reference voltage generation circuit equals to 1.5 V. In this case, when the control voltage Vc provided to the control terminal 124 is 3 V, the drain electrode and the source electrode of the field effect transistor 131 serving as a switching element are provided with a voltage of 3 V, while the gate electrode thereof is provided with a voltage of 1.5 V. Further, the drain electrode and the source electrode of the field effect transistor 132 serving as a switching element are provided with a voltage of 1.5 V, while the gate electrode thereof is provided with a voltage of 3 V.

The threshold voltages Vth of the field effect transistors 131 and 132 are assumed to be −0.7 V. In the field effect transistor 131, the gate electrode is at a potential lower than the potential lower than those of the source electrode and the drain electrode by the threshold voltage Vth of the field effect transistor 131. This results in a high impedance between the source electrode and the drain electrode of the field effect transistor 131. Thus, the field effect transistor 131 is OFF. In contrast, in the field effect transistor 132, the gate electrode is at a potential exceeding 0 V which is higher than those of the source electrode and the drain electrode. This results in a low impedance between the source electrode and the drain electrode of the field effect transistor 132. Thus, the field effect transistor 132 is ON.

In this state, when a high frequency signal is inputted through the signal input terminal 125, the high frequency signal is transmitted through the field effect transistor 132 having a low impedance, and then outputted through the signal output terminal 128. Further, the high frequency signal inputted through the signal input terminal 125 is blocked by the field effect transistor 131 having a high impedance, and hence not outputted through the signal output terminal 127. As a result, the high frequency signal inputted through the signal input terminal 125 is outputted from the signal output terminal 128.

According to the circuit configuration of the high frequency switch of FIG. 6, the value of the control voltage provided to the control terminal 124 can control the high frequency switch using the MES FETs. Here, positive voltage values are sufficient for this control voltage.

FIG. 7 shows the relation between the control voltage Vc of the SPDT switch circuit of FIG. 6 and the insertion loss between the signal input terminal 125 and the signal output terminal 127 or 128. In FIG. 7, the state that the insertion loss is 0 dB or the like is defined as a conductive state, while the state that the insertion loss is −20 dB or lower is defined as a cut-off state.

In FIG. 7, in the region where the control voltage Vc and the reference voltage Vref are in the relation Vc<Vref−|Vth|, the gate electrode of the field effect transistor 131 is at a potential higher than those of the source electrode and the drain electrode thereof. Thus, the field effect transistor 131 is ON. Further, the gate electrode of the field effect transistor 132 is at a potential lower than the potential lower than those of the source electrode and the drain electrode thereof by the threshold voltage Vth of the field effect transistor 132. Thus, the field effect transistor 132 is OFF. At this time, a high frequency signal inputted through the signal input terminal 125 is transmitted through the field effect transistor 131, and then outputted from the signal output terminal 127.

In contrast, in the region where the control voltage Vc and the reference voltage Vref are in the relation Vc>Vref+|Vth|, the gate electrode of the field effect transistor 131 is at a potential lower than the potential lower than those of the source electrode and the drain electrode thereof by the threshold voltage Vth of the field effect transistor 131. Thus, the field effect transistor 131 is OFF. Further, the gate electrode of the field effect transistor 132 is at a potential higher than those of the source electrode and the drain electrode thereof. Thus, the field effect transistor 132 is ON. At this time, a high frequency signal inputted through the signal input terminal 125 is transmitted through the field effect transistor 132, and then outputted from the signal output terminal 128.

Nevertheless, in the region where the control voltage Vc is in the range of Vref−|Vth|<Vc<Vref+|Vth|, the insertion loss of the field effect transistor 131 or 132 is in the range between 0 dB and −20 dB, whereby the ON/OFF states of the field effect transistors 131 and 132 are not certain. This indicates that a path between the signal input terminal 125 and the signal output terminal 127 or 128 cannot be selected in the SPDT switch circuit. That is, there is a voltage range not available in the setting of the control voltage Vc for controlling the SPDT switch circuit. This range is labeled an "uncertain region" in FIG. 7.

For example, in case that the power supply voltage Vdd is 3V, that the threshold voltages of the field effect transistors 131 and 132 are −0.7 V, and that the range of the control voltage Vc is 0 V through 3 V, the range between 0.8 V and 2.2 V (1.4 V width) is not available for the control voltage Vc. Since the range of the control voltage Vc is 0 V through 3 V, approximately a half of the range is not available for the control voltage Vc.

Described below is a high frequency amplifier circuit supporting a plurality of communication schemes such as PDC and W-CDMA. FIG. 8 is a detailed circuit block diagram of the high frequency amplifier circuit 104 of FIG. 5.

As shown in FIG. 8, in the high frequency amplifier circuit 104, a high frequency signal inputted through a signal input terminal 181 is provided through an impedance matching circuit 182 for performing impedance transformation, to a gain control circuit 183, whereby gain attenuation is performed on the high frequency input signal. The amount of attenuation in the gain control circuit 183 is controlled by the setting of the voltage value in a control terminal 189. The output signal of the gain control circuit 183 is provided to an amplifier 184, and thereby amplified. The output signal of the amplifier 184 is provided through an impedance matching circuit 185 for performing impedance transformation, to an amplifier 186, and thereby amplified. The output signal of the amplifier 186 is provided through an impedance matching circuit 187 for performing impedance transformation, to a signal output terminal 188.

Described below is the use of the high frequency amplifier circuit 104 of FIG. 8 in a high frequency circuit block of a communication terminal supporting a plurality of communication schemes. Here, the frequency and the output power used in the communication terminal are different in PDC scheme and in W-CDMA scheme. Thus, the circuit configuration of the high frequency amplifier circuit needs to be determined such as to meet the severer requirement in the high frequency characteristics of the communication schemes. For example, considered below is the situation that the output power used in the high frequency amplifier circuit is different in these communication schemes. In general, in a high frequency amplifier circuit, a higher output power requires a higher operation current in the high frequency amplifier circuit. Thus, the high frequency amplifier circuit needs to be designed such as to meet the power requirement of the higher output power.

A first problem is that in the prior art high frequency switch, the setting range of the control voltage of the high frequency switch depends on the power supply voltage of the high frequency switch, and that the setting range of the control voltage of the high frequency switch is narrow.

The reason is that there is a control voltage range where the ON/OFF state of the field effect transistors 131 or the field effect transistor 132 constituting the switch circuit is not determined. For example, in case that the power supply voltage Vdd is 3V, that the threshold voltages of the field effect transistors 131 and 132 are −0.7 V, and that the range of the control voltage Vc is 0 V through 3 V, the range between 0.8 V and 2.2 V (1.4 V width) is not available for the control voltage Vc. Since the range of the control voltage Vc is 0 V through 3 V, approximately a half of the range is not available for the control voltage Vc.

Further, the threshold voltage of the field effect transistor is almost constant independently of the power supply voltage. Thus, when the power supply voltage of the high frequency switch decreases, the power supply voltage of the reference voltage terminal also decreases, whereby the available setting range of the control voltage becomes narrower.

A second problem is that in the configuration of a high frequency amplifier circuit supporting a plurality of communication schemes, the operation current increases in the high frequency amplifier circuit.

The reason is that when the high frequency characteristics such as the output power required in the communication terminal is different in each communication scheme, the circuit configuration of the high frequency amplifier circuit needs to be determined such as to meet the severer requirement in the high frequency characteristics of the communication schemes. Thus, in the operation mode of the communication scheme using the lower output power, the operation current flows excessively.

In particular, a portable telephone terminal of W-CDMA scheme needs to communicate with a base station continuously during the telephone call, and thereby tends to consume a higher power. Accordingly, in order that a longer usable time is obtained with a battery having a limited capacity, the operation current is preferably reduced in the operation mode of the communication scheme using the lower output power. Further, this needs to be implemented without conflicting with the size and weight reduction.

SUMMARY OF THE INVENTION

An object of the invention is to provide a high frequency switch in which the setting range of the control voltage is expanded.

Another object of the invention is to provide an amplifying circuit which supports a plurality of communication schemes and in which the operation current is reduced.

Another object of the invention is to provide a mobile communication terminal in which the setting range of the control voltage is expanded.

Another object of the invention is to provide a mobile communication terminal which supports a plurality of communication schemes and in which the operation current is reduced.

A high frequency switch according to Invention 1 comprises: a signal input terminal; first and second signal output terminals; a control terminal to which a control voltage is applied; a switch; and a reference voltage generation circuit.

The switch is provided with a first switch element having one and the other signal electrodes and a control electrode, the signal input terminal being connected to the one signal electrode, the first signal output terminal being connected to the other signal electrode, and the control terminal being connected to any one of the one and the other signal electrodes, and with a second switch element having one and the other signal electrodes and a control electrode, the signal input terminal being connected to the one signal electrode, the second signal output terminal being connected to the other signal electrode, and the control terminal being connected to the control electrode.

The reference voltage generation circuit has the function of generating first and second reference voltages the values of which are different from each other, then providing the first reference voltage to the control electrode of the first switch element, and then providing the second reference voltage to any one of the one and the other signal electrodes of the second switch element.

Then, on the basis of the relation between the control voltage and the first reference voltage and the relation between the control voltage and the second reference voltage, depending on the value of the control voltage, the high frequency switch makes selectively the first and second switch elements conductive.

According to this configuration, depending on the voltage value applied to the control terminal, the signal inputted through the signal input terminal is outputted selectively from any one of the first and second signal output terminals.

Further, when the values of the first and second reference voltages are made different from each other, the control voltage range of the intermediate state between a conductive state and an open state of the second switch element can be shifted relative to the control voltage range of the intermediate state between a conductive state and an open state of the first switch element in comparison with the control voltage range in the prior art. Accordingly, the control voltage range of the intermediate state between a conductive state and an open state of the first switch element can overlap the control voltage range of the intermediate state between a conductive state and an open state of the second switch element. Thus, the voltage range of the control voltage for setting the first switch element and the second switch element to be conductive or open can be expanded.

In the high frequency switch according to Invention 1, the first switch element is preferably composed of a first field effect transistor. In this case, anyone of the source electrode and the drain electrode serves as the one signal electrode. The other one of the source electrode and the drain electrode serves as the other signal electrode. The gate electrode serves as the control electrode. Further, the second switch element is preferably composed of a second field effect transistor. In this case, any one of the source electrode and the drain electrode serves as the one signal electrode. The other one of the source electrode and the drain electrode serves as the other signal electrode. The gate electrode serves as the control electrode.

According to this configuration, effects similar to those of the high frequency switch according to Invention 1 are obtained.

When the first and second switch elements are composed of field effect transistors, for example, the second reference voltage is set higher than the first reference voltage.

According to this configuration, effects similar to those of the high frequency switch according to Invention 1 are obtained.

When the first and second switch elements are composed of field effect transistors, the difference between the first reference voltage and the second reference voltage is preferably set approximately equal to the threshold value of the first and second field effect transistors.

According to this configuration, effects similar to those of the high frequency switch according to Invention 1 are obtained. In addition, the control voltage range of the intermediate state between a conductive state and an open state of the first switch element can overlap almost completely the control voltage range of the intermediate state between a conductive state and an open state of the second switch element. Thus, the voltage range of the control voltage for setting the first switch element and the second switch element to be conductive or open can be set widest.

When the first and second switch elements are composed of field effect transistors, the reference voltage generation circuit comprises a serial circuit of, for example, three or more resistors.

According to this configuration, effects similar to those of the high frequency switch according to Invention 1 are obtained. In addition, the reference voltage generation circuit can have a simple configuration. This permits size reduction of the circuit.

When the first and second switch elements are composed of field effect transistors, it is preferable that the field effect transistor comprises a source electrode, a drain electrode, and at least one or more gate electrodes, that the gate electrode is arranged between the source electrode and the drain electrode, and that the gate electrode and the control terminal or an output terminal of the reference voltage generation circuit are interconnected through a resistor.

According to this configuration, effects similar to those of the high frequency switch according to Invention 1 are obtained. In addition, when the field effect transistor comprises two or more gate electrodes, the distortion characteristics for the signal level of the field effect transistor input can be improved without the necessity of increasing the gate width of the field effect transistor.

An amplifying circuit according to Invention 2 comprises: a signal input terminal; first and second signal output terminals; a control terminal to which a control voltage is applied; a switch; a first amplifier; a second amplifier; and a reference voltage generation circuit.

The switch is provided with a first switch element having one and the other signal electrodes and a control electrode, the signal input terminal being connected to the one signal electrode, and the control terminal being connected to any one of the one and the other signal electrodes, and with a second switch element having one and the other signal electrodes and a control electrode, the signal input terminal being connected to the one signal electrode, and the control terminal being connected to the control electrode.

In the first amplifier, an input terminal thereof is connected to the other signal electrode of the first switch element, while an output terminal thereof is connected to the first signal output terminal.

In the second amplifier, an input terminal thereof is connected to the other signal electrode of the second switch element, while an output terminal thereof is connected to the second signal output terminal.

The reference voltage generation circuit has the function of generating first and second reference voltages, then providing the first reference voltage to the control electrode of the first switch element, and then providing the second reference voltage to any one of the one and the other signal electrodes of the second switch element.

Then, on the basis of the relation between the control voltage and the first reference voltage and the relation between the control voltage and the second reference voltage, depending on the value of the control voltage, the amplifying circuit makes selectively the first and second switch elements conductive. Then, when the first switch element is conductive, the first amplifier is made active, while the second amplifier is made inactive. When the second switch element is conductive, the first amplifier is made inactive, while the second amplifier is made active.

According to this configuration, depending on the voltage value applied to the control terminal, the signal inputted through the signal input terminal is amplified into an amplified signal, and then outputted selectively from any one of the first and second signal output terminals.

Further, since the first amplifier and the second amplifier are interconnected through the switch, the amplifiers can be arranged so as to support a plurality of communication schemes (such as PDC and W-CDMA). This permits each amplifier to be designed corresponding to each communication scheme. This permits the circuit to be designed into an optimum size, and hence avoids an increase in the circuit size and the operation current.

In the amplifying circuit according to Invention 2, the first switch element is preferably composed of a first field effect transistor. In this case, any one of the source electrode and the drain electrode serves as the one signal electrode. The other one of the source electrode and the drain electrode serves as the other signal electrode. The gate electrode serves as the control electrode. Further, the second switch element is preferably composed of a second field effect transistor. In this case, anyone of the source electrode and the drain electrode serves as the one signal electrode. The other one of the source electrode and the drain electrode serves as the other signal electrode. The gate electrode serves as the control electrode. Further, the first amplifier is preferably composed of a third field effect transistor. In this case, the gate electrode serves as the input terminal. The drain electrode serves as the output terminal. The source electrode is grounded in the sense of high frequency. Further, the second amplifier is preferably composed of a fourth field effect transistor. In this case, the gate electrode serves as the input terminal. The drain electrode serves as the output terminal. The source electrode is grounded in the sense of high frequency.

According to this configuration, effects similar to those of the amplifying circuit according to Invention 2 are obtained. In addition, when the values of the first and second reference voltages are made different from each other, the control voltage range of the intermediate state between a conductive state and an open state of the second switch element can be shifted relative to the control voltage range of the intermediate state between a conductive state and an open state of the first switch element in comparison with the control voltage range in the prior art. Accordingly, the control voltage range of the intermediate state between a conductive state and an open state of the first switch element can overlap the control voltage range of the intermediate state between a conductive state and an open state of the second switch element. Thus, the voltage range of the control voltage for setting the first switch element and the second switch element to be conductive or open can be expanded.

When the first and second switch elements are composed of field effect transistors, for example, the second reference voltage is set higher than the first reference voltage.

According to this configuration, effects similar to those of the amplifying circuit according to Invention 2 are obtained.

When the first and second switch elements are composed of field effect transistors, the difference between the first reference voltage and the second reference voltage is preferably set approximately equal to the threshold value of the first and second field effect transistors.

According to this configuration, effects similar to those of the amplifying circuit according to Invention 2 are obtained. In addition, the control voltage range of the intermediate state between a conductive state and an open state of the first switch element can overlap almost completely the control voltage range of the intermediate state between a conductive state and an open state of the second switch element. Thus, the voltage range of the control voltage for setting the first switch element and the second switch element to be conductive or open can be set widest.

When the first and second switch elements are composed of field effect transistors, the reference voltage generation circuit comprises a serial circuit of, for example, three or more resistors.

According to this configuration, effects similar to those of the amplifying circuit according to Invention 2 are obtained. In addition, the reference voltage generation circuit can have a simple configuration. This permits size reduction of the circuit.

In the amplifying circuit according to Invention 2, the control terminal and any one of power supply terminals of the first and second amplifiers are preferably connected in common.

According to this configuration, effects similar to those of the amplifying circuit according to Invention 2 are obtained.

In addition, avoided is the necessity of providing separately a control terminal of the switch. This reduces the number of terminals. Further, a single terminal permits the control of the operation/stop of the amplifier and the control of the path selection of the switch, and thereby simplifies the control.

In the amplifying circuit according to Invention 2, preferably provided is a third amplifier an output terminal of which is connected to the signal input terminal. In this case, a signal inputted to an input terminal of the third amplifier is amplified and then provided to the signal input terminal. Further, a power supply terminal of the third amplifier is preferably connected in common with a power supply terminal of the reference voltage generation circuit.

According to this configuration, effects similar to those of the amplifying circuit according to Invention 2 are obtained. In addition, the third amplifier provided in this circuit increases the overall gain. Further, avoided is the necessity of providing separately a power supply terminal of the reference voltage generation circuit. This reduces the number of terminals.

An amplifying circuit according to Invention 3 comprises: a signal input terminal; first and second signal output terminals; a control terminal to which a control voltage is applied; a switch; a reference voltage generation circuit; and an amplifier an output terminal of which is connected to the signal input terminal.

The switch is provided with a first switch element having one and the other signal electrodes and a control electrode, the signal input terminal being connected to the one signal electrode, the first signal output terminal being connected to the other signal electrode, and the control terminal being connected to any one of the one and the other signal electrodes, and with a second switch element having one and the other signal electrodes and a control electrode, the signal input terminal being connected to the one signal electrode, the second signal output terminal being connected to the other signal electrode, and the control terminal being connected to the control electrode.

The reference voltage generation circuit generates first and second reference voltages the values of which are different from each other, then provides the first reference voltage to the control electrode of the first switch element, and then provides the second reference voltage to any one of the one and the other signal electrodes of the second switch element.

Then, on the basis of the relation between the control voltage and the first reference voltage and the relation between the control voltage and the second reference voltage, depending on the value of the control voltage, the first and second switch elements are selectively made conductive. Further, a signal inputted to an input terminal of the amplifier is amplified and then provided to the signal input terminal. Furthermore, a power supply terminal of the amplifier is connected in common with a power supply terminal of the reference voltage generation circuit.

According to this configuration, depending on the voltage value applied to the control terminal, the signal inputted through the signal input terminal is amplified into an amplified signal, and then outputted selectively from any one of the first and second signal output terminals.

In addition, the amplifier provided in this circuit increases the overall gain. Further, avoided is the necessity of providing separately a power supply terminal of the reference voltage generation circuit. This reduces the number of terminals.

A mobile communication terminal according to Invention 4 is a mobile communication terminal comprising a high frequency switch having the function of selecting the path of a high frequency signal, the high frequency switch comprising: a signal input terminal; first and second signal output terminals; a control terminal to which a control voltage is applied; a switch; and a reference voltage generation circuit.

The switch is provided with a first switch element having one and the other signal electrodes and a control electrode, the signal input terminal being connected to the one signal electrode, the first signal output terminal being connected to the other signal electrode, and the control terminal being connected to any one of the one and the other signal electrodes, and with a second switch element having one and the other signal electrodes and a control electrode, the signal input terminal being connected to the one signal electrode, the second signal output terminal being connected to the other signal electrode, and the control terminal being connected to the control electrode.

The reference voltage generation circuit has the function of generating first and second reference voltages the values of which are different from each other, then providing the first reference voltage to the control electrode of the first switch element, and then providing the second reference voltage to any one of the one and the other signal electrodes of the second switch element.

Then, on the basis of the relation between the control voltage and the first reference voltage and the relation between the control voltage and the second reference voltage, depending on the value of the control voltage, the high frequency switch makes selectively the first and second switch elements conductive.

According to this configuration, effects similar to those of the high frequency switch according to Invention 1 are obtained.

A mobile communication terminal according to Invention 5 is a mobile communication terminal comprising an amplifying circuit having the function of selecting the path of a high frequency signal, the amplifying circuit comprising: a signal input terminal; first and second signal output terminals; a control terminal to which a control voltage is applied; a switch; a first amplifier; a second amplifier; and a reference voltage generation circuit.

The switch is provided with a first switch element having one and the other signal electrodes and a control electrode, the signal input terminal being connected to the one signal electrode, and the control terminal being connected to any one of the one and the other signal electrodes, and with a second switch element having one and the other signal electrodes and a control electrode, the signal input terminal being connected to the one signal electrode, and the control terminal being connected to the control electrode.

In the first amplifier, an input terminal thereof is connected to the other signal electrode of the first switch element, while an output terminal thereof is connected to the first signal output terminal.

In the second amplifier, an input terminal thereof is connected to the other signal electrode of the second switch element, while an output terminal thereof is connected to the second signal output terminal.

The reference voltage generation circuit has the function of generating first and second reference voltages, then providing the first reference voltage to the control electrode of the first switch element, and then providing the second reference voltage to any one of the one and the other signal electrodes of the second switch element.

Then, on the basis of the relation between the control voltage and the first reference voltage and the relation between the control voltage and the second reference voltage, depending on the value of the control voltage, the amplifying circuit makes selectively the first and second switch elements conductive. Then, when the first switch element is conductive, the first amplifier is made active, while the second amplifier is made inactive. When the second switch element is conductive, the first amplifier is made inactive, while the second amplifier is made active.

According to this configuration, effects similar to those of the amplifying circuit according to Invention 2 are obtained.

A mobile communication terminal according to Invention 6 is a mobile communication terminal comprising an amplifying circuit having the function of selecting the path of a high frequency signal, the amplifying circuit comprising: a signal input terminal; first and second signal output terminals; a control terminal to which a control voltage is applied; a switch; a reference voltage generation circuit; and an amplifier an output terminal of which is connected to the signal input terminal.

The switch is provided with a first switch element having one and the other signal electrodes and a control electrode, the signal input terminal being connected to the one signal electrode, the first signal output terminal being connected to the other signal electrode, and the control terminal being connected to any one of the one and the other signal electrodes, and with a second switch element having one and the other signal electrodes and a control electrode, the signal input terminal being connected to the one signal electrode, the second signal output terminal being connected to the other signal electrode, and the control terminal being connected to the control electrode.

The reference voltage generation circuit generates first and second reference voltages the values of which are different from each other, then provides the first reference voltage to the control electrode of the first switch element, and then provides the second reference voltage to any one of the one and the other signal electrodes of the second switch element.

Then, on the basis of the relation between the control voltage and the first reference voltage and the relation between the control voltage and the second reference voltage, depending on the value of the control voltage, the first and second switch elements are selectively made conductive. Further, a signal inputted to an input terminal of the amplifier is amplified and then provided to the signal input terminal. Furthermore, a power supply terminal of the amplifier is connected in common with a power supply terminal of the reference voltage generation circuit.

According to this configuration, effects similar to those of the amplifying circuit according to Invention 3 are obtained.

DETAILED DESCRIPTION OF THE INVENTION

High frequency amplifier circuits according to the embodiments of the invention and portable telephone terminals using the same are described below with reference to the drawings.

[Embodiment 1]

Figure 1:
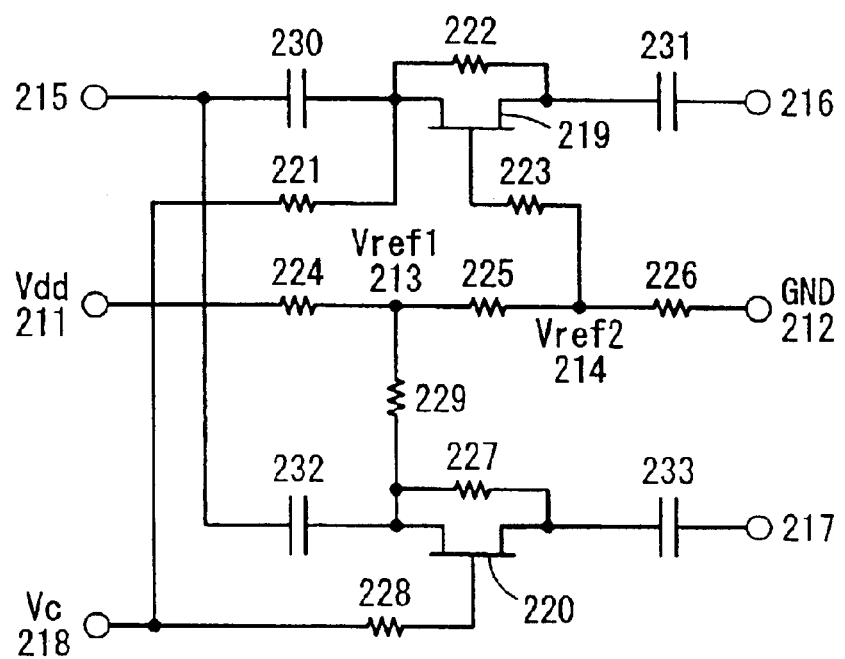
FIG. 1 is a block diagram showing the configuration of a high frequency switch according to Embodiment 1 of the invention.
Figure 4:
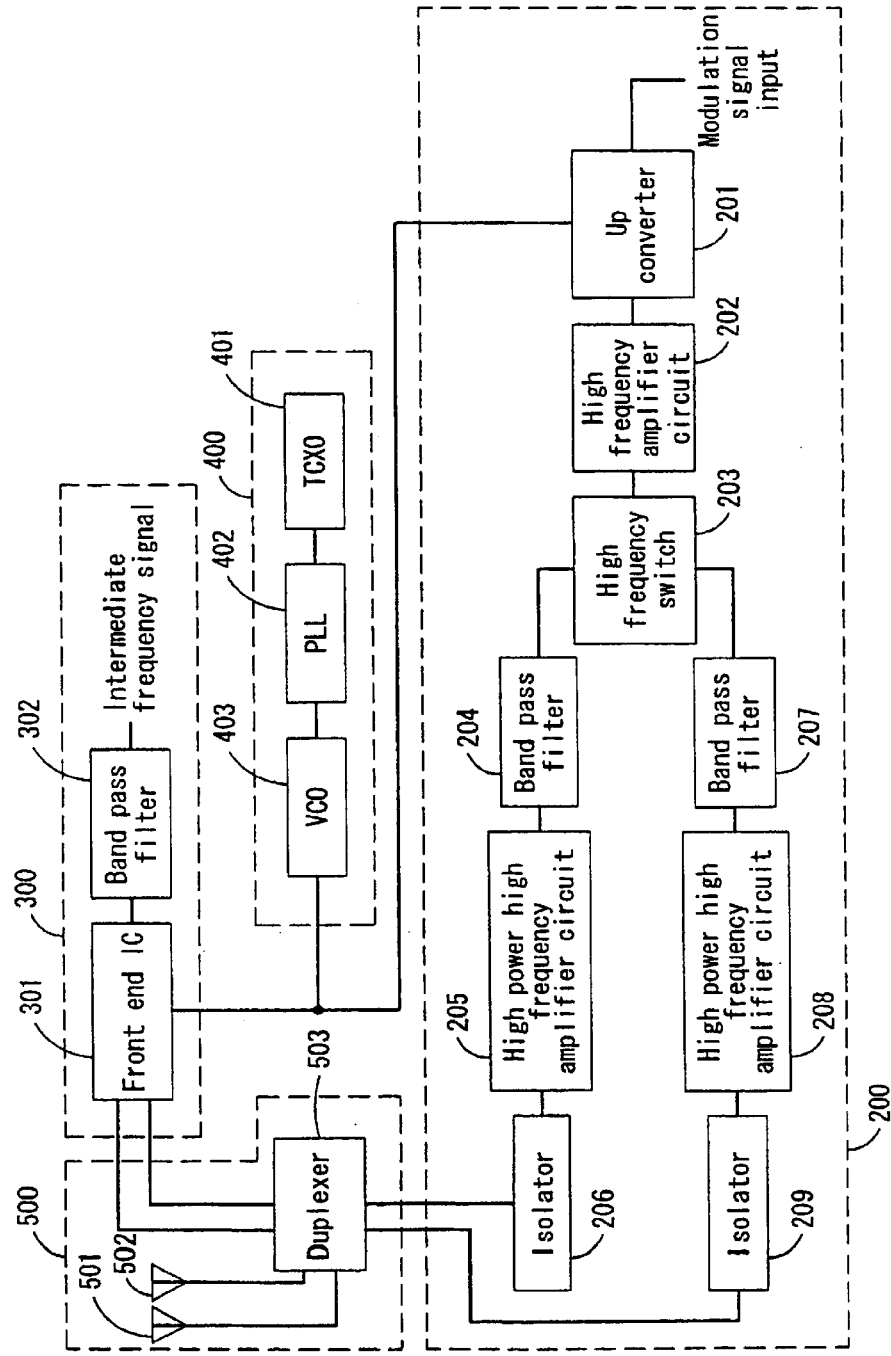
FIG. 4 is a block diagram showing the configuration of a radio section of a prior art portable telephone terminal.

FIG. 1 is a block diagram showing the configuration of a high frequency amplifier circuit according to Embodiment 1 of the invention. The high frequency switch of FIG. 1 is a SPDT switch circuit, and corresponds to the high frequency switch 203 in the block diagram showing the transmitting section of the prior art portable telephone terminal of FIG. 4. That is, in the portable telephone terminal according to the present embodiment of the invention, the high frequency switch of FIG. 1 is used in place of the high frequency switch 203 in the transmitting section of the prior art portable telephone terminal of FIG. 4.

The high frequency switch of FIG. 1 is described below in detail.

In FIG. 1, the source electrode of a field effect transistor 219 serving as a switch element is connected through a capacitor 230 to a signal input terminal 215, while the drain electrode of the field effect transistor 219 is connected through a capacitor 231 to a signal output terminal 216. Further, the source electrode of a field effect transistor 220 serving as a switch element is connected through a capacitor 232 to the signal input terminal 215, while the drain electrode of the field effect transistor 220 is connected through a capacitor 233 to a signal output terminal 217. Here, the source electrode and the drain electrode in each of the field effect transistors 219 and 220 are structurally identical to each other. Thus, the above-mentioned connection may be reversed.

The source electrode of the field effect transistor 219 is connected through a resistor 221 to a control terminal 218. The gate electrode of the field effect transistor 220 is connected through a resistor 228 to the control terminal 218.

The source electrode and the drain electrode of the field effect transistor 219 are interconnected through a resistor 222, and thereby maintained at the same potential. The source electrode and the drain electrode of the field effect transistor 220 are interconnected through a resistor 227, and thereby maintained at the same potential.

A serial circuit of resistors 224, 225, 226 is connected between a power supply terminal 211 and a ground terminal 212, whereby two connection points in the serial circuit of the resistors 224, 225, 226 serve as a reference voltage terminal 213 and a reference voltage terminal 214. The gate electrode of the field effect transistor 219 is connected through a resistor 223 to the reference voltage terminal 214. The source electrode of the field effect transistor 220 is connected through a resistor 229 to the reference voltage terminal 213.

A reference voltage generation circuit is composed of the serial circuit of the resistors 224, 225, 226 connected between the power supply terminal 211 and the ground terminal 212. Capacitors 230–233 are inserted for eliminating DC components. The resistors 221, 222, 223, 227, 228, 229 have high resistance values. The control terminal (Vc) 218 is used for controlling the operation state of the switch circuit.

The operation of the high frequency switch in the circuit of FIG. 1 is described below in brief. The relation between the control voltage Vc provided to the control terminal 218 and the reference voltage Vref1 or the reference voltage Vref2 obtained from the reference voltage generation circuit is set to be a predetermined state, whereby the field effect transistors 219 and 220 are selectively made conductive or open. More specifically, the conduction between the source electrode and the drain electrode of each of the field effect transistors 219 and 220 is made conductive or open. This implements the switching between the signal input terminal 215 and the signal output terminal 216 or 217.

Here, the resistors 221, 222, 223, 227, 228, 229 are assumed to have high resistance values. Further, the voltage drop across each of the resistors 221–223 and 227–229 is assumed to be negligible. The potential at each terminal and each electrode is as follows. That is, the control terminal 218 to which the control voltage Vc is provided, the gate electrode of the field effect transistor 220, and the source electrode and the drain electrode of the field effect transistor 219 are at the same potential. The reference voltage terminal 213 and the source electrode and the drain electrode of the field effect transistor 220 are at the same potential. The reference voltage terminal 214 and the gate electrode of the field effect transistor 219 are at the same potential.

In the switching operation of the circuit of FIG. 1, the control voltage provided to the control terminal 218 is denoted by Vc, the reference voltage appearing in the reference voltage terminal 213 is denoted by Vref1, and the reference voltage appearing in the reference voltage terminal 214 is denoted by Vref2. Then, the relation of the conductive/open state between the source electrode and the drain electrode of the field effect transistor 219 and the field effect transistor 220 is as follows.

For the field effect transistor 219
Vc<Vref2 Source-drain: conductive
Vc>Vref2+|Vth| Source-drain: open
For the field effect transistor 220
Vc>Vref1 Source-drain: conductive
Vc<Vref1−|Vth| Source-drain: open
Here, the threshold value of the field effect transistor 219 and the field effect transistor 220 is denoted by Vth.

When the control voltage Vc is in the relation $Vref2 < Vc < Vref2+|Vth|$ with the reference voltage Vref2, the conduction between the source electrode and the drain electrode of the field effect transistor 219 is in an intermediate state between a conductive state and an open state.

When the control voltage Vc is in the relation $Vref1-|Vth| < Vc < Vref1$ with the reference voltage Vref1, the conduction between the source electrode and the drain electrode of the field effect transistor 220 is in an intermediate state between a conductive state and an open state.

Such a control voltage range is not available as the voltage setting value for controlling the switch. Thus, for the purpose of expanding the operation range of the switch circuit, considered below is a method for overlapping these control voltage ranges where the conduction between the source electrode and the drain electrode of the field effect transistor 219 and the field effect transistor 220 are in an intermediate state between a conductive state and an open state.

Here, the following relation holds between the reference voltages Vref1 and Vref2.

$$Vref2 = Vref1 - |Vth| \quad (1)$$

When the upper limit of the control voltage Vc equals to the power supply voltage Vdd of the switch circuit, in order that the control voltage Vc ranges where the field effect transistor 219 and the field effect transistor 220 are conductive are the same, the following relation holds among the power supply voltage Vdd and the reference voltages Vref1 and Vref2.

$$Vdd \; (Vref1 + Vref2) \quad (2)$$

From Equations (1) and (2), the following relations are obtained among the reference voltages Vref1 and Vref2, the power supply voltage Vdd, and the threshold value Vth of the field effect transistor.

$$Vref1 = 0.5 \times Vdd + 0.5 \times |Vth|$$

$$Vref2 = 0.5 \times Vdd - 0.5 \times |Vth|$$

The operation of the switch circuit of FIG. 1 is described below. As an example, it is assumed that the power supply voltage Vdd is 3 V, that the upper limit of the control voltage Vc is 3V, and that the threshold value Vth of the field effect transistor 219 and the field effect transistor 220 is −0.7 V. In this case, the reference voltages Vref1 and the reference voltages Vref2 are 1.15 V and 1.85 V, respectively.

The reference voltages Vref1 and the reference voltages Vref2 are not limited to these values. For example, as long as the reference voltage Vref1 is within a range of 1.15±0.34 V, the control voltage range can be expanded in comparison with the prior art. Similarly, as long as the reference voltage Vref2 is within a range of 1.85±0.34 V, the control voltage range can be expanded in comparison with the prior art. It should be noted that the control voltage range has been 0–0.8 V and 2.2–3V in the prior art.

Further, the threshold value of the field effect transistors is not limited to −0.7 V. Furthermore, the two field effect transistors do not need to have the same threshold value.

Figure 2:
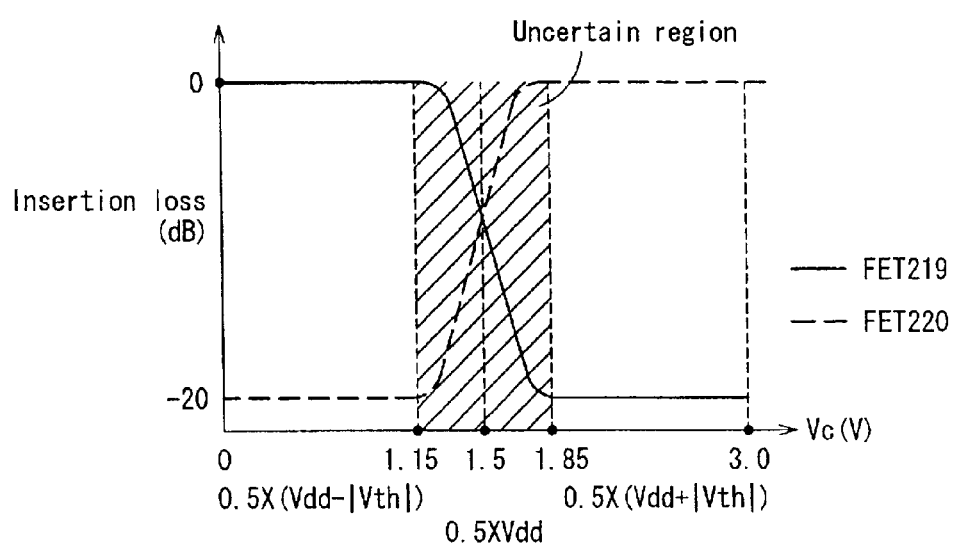
FIG. 2 is a graph showing the state of a switch in a high frequency switch according to Embodiment 1 of the invention.

FIG. 2 shows the relation between the control voltage Vc of the high frequency switch of FIG. 1 and the insertion loss between the signal input terminal 215 and the signal output terminal 216 or 217. In FIG. 2, the state that the insertion loss is 0 dB or the like is defined as a conductive state, while the state that the insertion loss is −20 dB or lower is defined as a cut-off state.

In FIG. 2, in the region where the control voltage Vc is Vc<0.5×(Vdd−|Vth|), the gate electrode of the field effect transistor 219 is at a potential higher than those of the source electrode and the drain electrode thereof. Thus, the conduction between the source electrode and the drain electrode of the field effect transistor 219 is conductive. Further, the gate electrode of the field effect transistor 220 is at a potential lower than the potential lower than those of the source electrode and the drain electrode thereof by the threshold voltage Vth of the field effect transistor 220. At this time, a high frequency signal inputted through the signal input terminal 215 is transmitted through the field effect transistor 219, and then outputted from the signal output terminal 216.

In contrast, in the region where the control voltage Vc is Vc>0.5×(Vdd+|Vth|), the gate electrode of the field effect transistor 219 is at a potential lower than the potential lower than those of the source electrode and the drain electrode thereof by the threshold voltage Vth of the field effect transistor 219. Thus, the conduction between the source electrode and the drain electrode of the field effect transistor 219 is open. Further, the gate electrode of the field effect transistor 220 is at a potential higher than those of the source electrode and the drain electrode thereof. Thus, the conduction between the source electrode and the drain electrode of the field effect transistor 220 is conductive. At this time, a high frequency signal inputted through the signal input terminal 215 is transmitted through the field effect transistor 220, and then outputted from the signal output terminal 217.

In the range where the control voltage Vc is 0.5×(Vdd−|Vth|)<Vc<0.5×(Vdd+|Vth|), the insertion loss of the field effect transistor 219 or the field effect transistor 220 is in the range between 0 dB and −20 dB, whereby the conduction between the source electrode and the drain electrode of the field effect transistor 219 and the field effect transistor 220 is in an intermediate state between a conductive state and an open state. In this case, a path between the signal input terminal 215 and the signal output terminal 216 or 217 cannot be selected in the high frequency switch. The range of the control voltage Vc in this case is 1.15 V through 1.85 V (0.7 V width).

In the circuit of FIG. 1, the switching of the high frequency switch is implemented by the control voltage Vc. Further, the two reference voltages are provided and used in the field effect transistors in the high frequency switch. By virtue of this, the setting range of the control voltage has been expanded.

Figure 9:
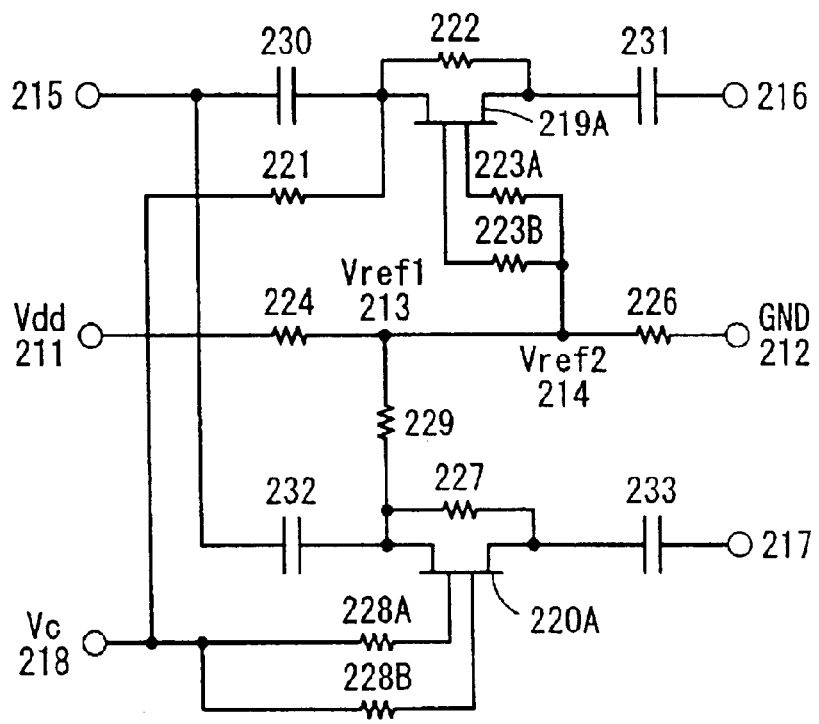
FIG. 9 is a circuit diagram showing the configuration of another example of a high frequency switch according to Embodiment 1 of the invention.

In the circuit of FIG. 1, the field effect transistors 219 and 220 have been composed of single-gate field effect transistors. However, multi-gate field effect transistors may be used in which a plurality of (two or more) gate electrodes are arranged between the source electrode and the drain electrode as shown in FIG. 9. In FIG. 9, reference numerals 219A and 220A indicate multi-gate field effect transistors. Reference numerals 223A and 223B indicate resistors connected between each of the two gate electrodes of the multi-gate field effect transistor 219A and the reference voltage terminal 214. Reference numerals 228A and 228B indicate resistors connected between each of the two gate electrodes of the multi-gate field effect transistor 220A and the control terminal 218. The other configuration is similar to that of FIG. 1.

When such multi-gate field effect transistors are used, the distortion characteristics for the signal level of the field effect transistor input can be improved without the necessity of increasing the gate width of the multi-gate field effect transistors 219A and 220A in comparison with that of the single-gate field effect transistors 219 and 220.

Further, in the multi-gate field effect transistors 219A and 220A, when a plurality of the gate electrodes arranged between the source electrode and the drain electrode are connected respectively through resistors 223A, 223B, 228A, 228B to the control terminal 218 or the reference voltage terminal 211, the isolation of the gate electrodes is improved. This permits the construction of the high frequency switch without degradation in the high frequency characteristics.

[Embodiment 2]

Figure 3:
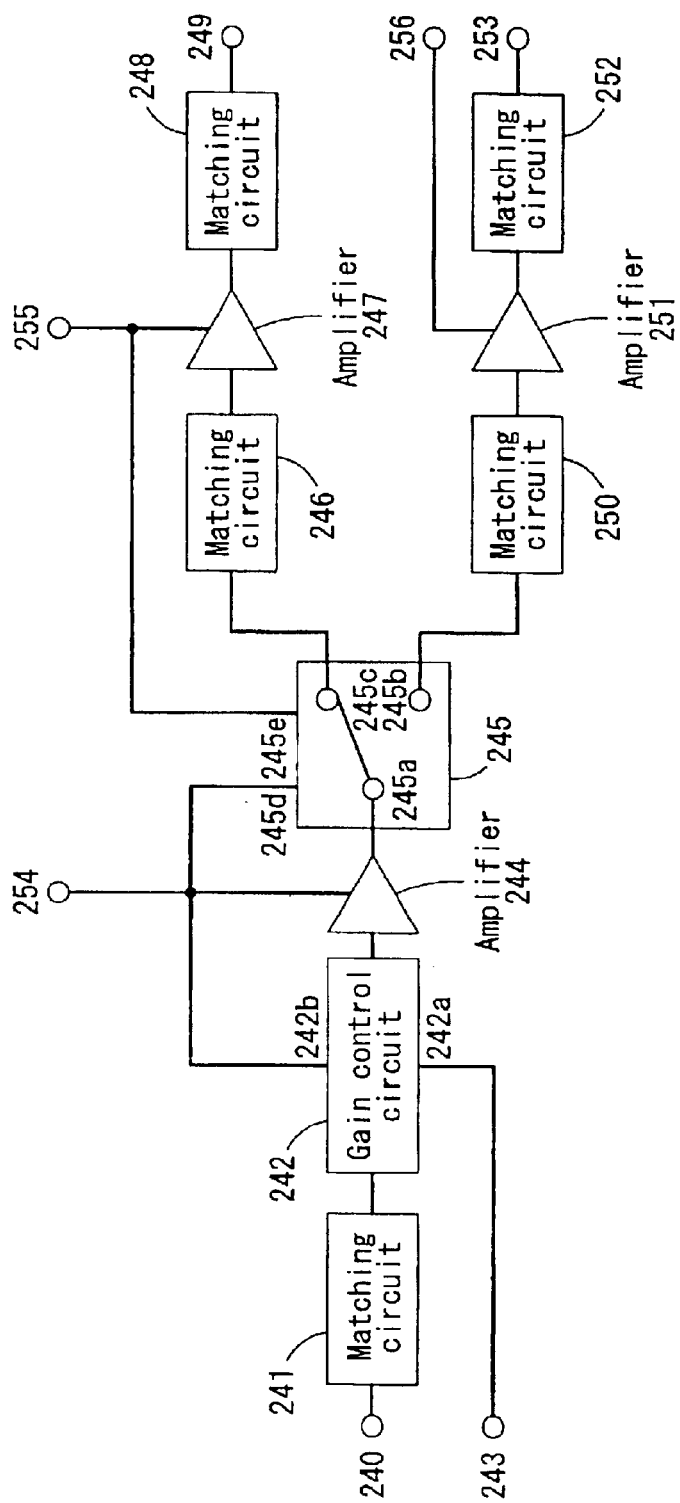
FIG. 3 is a block diagram showing the configuration of an amplifying circuit according to Embodiment 2 of the invention.
Figure 5:
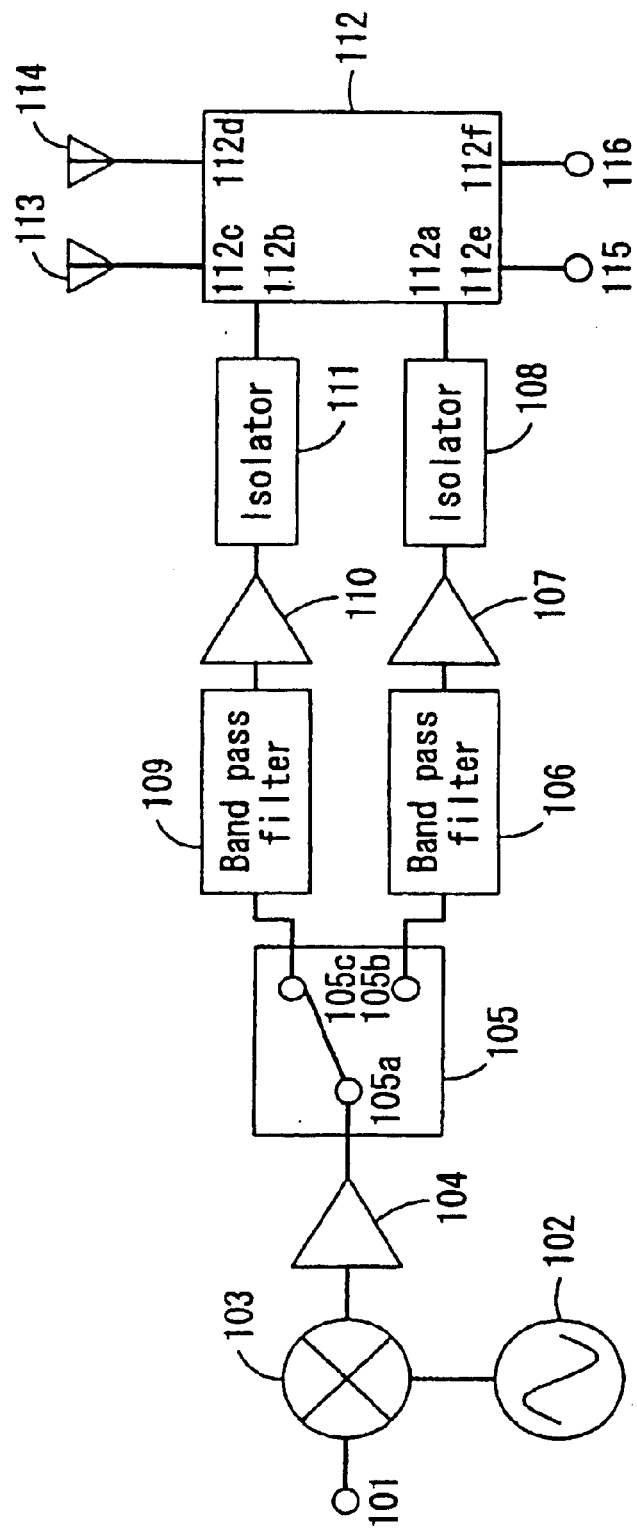
FIG. 5 is a block diagram showing the configuration of a radio section of another prior art portable telephone terminal.
Figure 6:
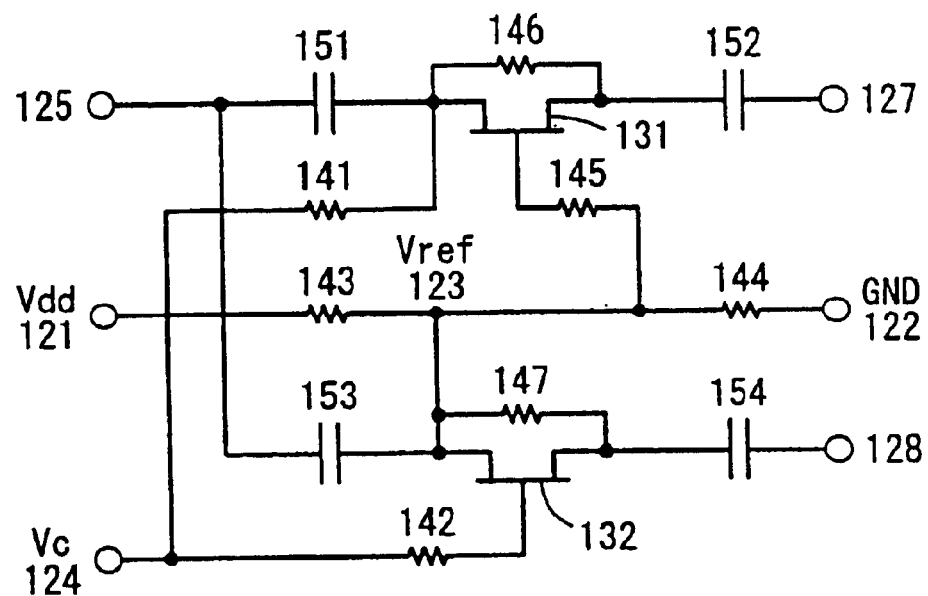
FIG. 6 is a block diagram showing the configuration of a prior art high frequency switch.
Figure 7:
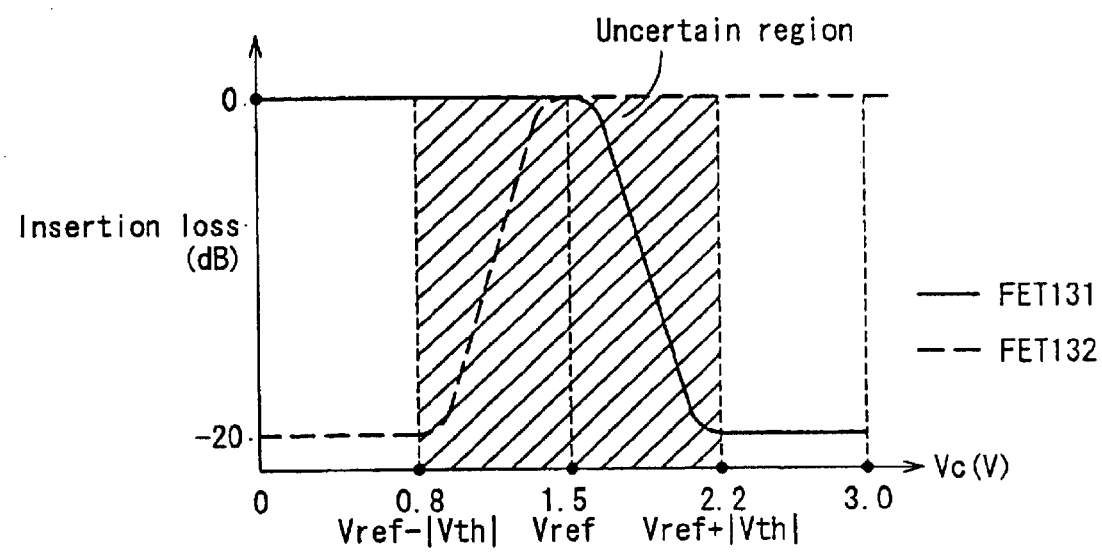
FIG. 7 is a graph showing the state of a switch in a prior art high frequency switch.
Figure 8:
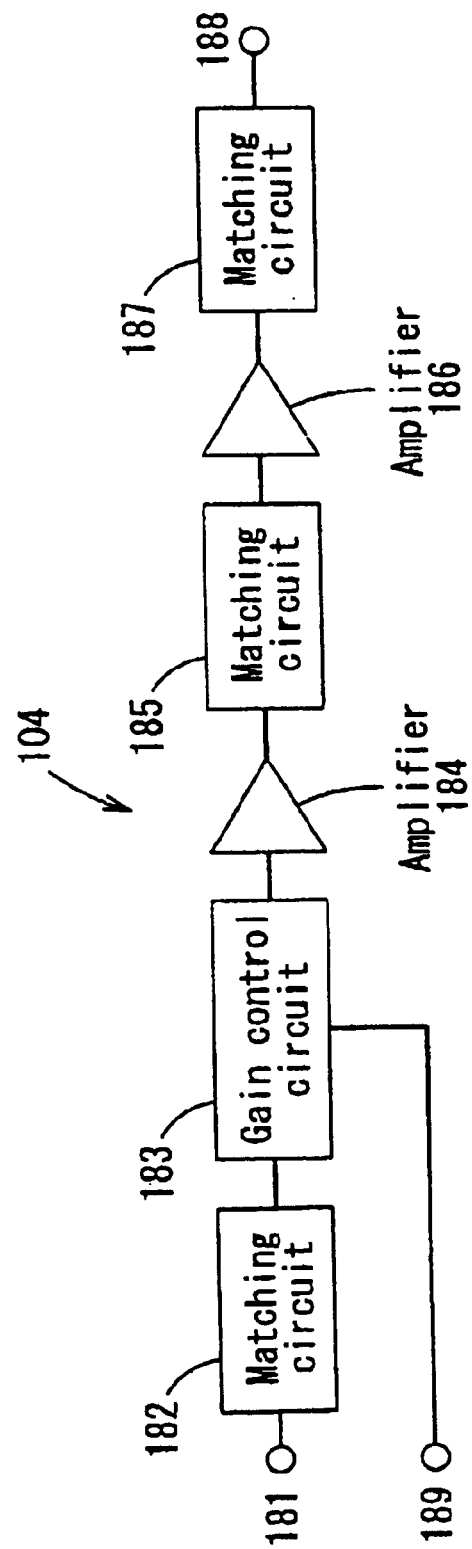
FIG. 8 is a block diagram showing the configuration of a high frequency amplifier circuit provided with a prior art gain control function.

FIG. 3 is a block diagram showing the configuration of a high frequency circuit comprising an amplifying circuit according to Embodiment 2 of the invention. The amplifying circuit of FIG. 3 corresponds to the high frequency amplifier circuit 104 and the high frequency switch 105 in the block diagram showing the transmitting section of the prior art portable telephone terminal of FIG. 5. In the portable telephone terminal according to the present embodiment of the invention, the amplifying circuit of FIG. 3 is used in place of the high frequency amplifier circuit 202 and the high frequency switch 203 in the transmitting section 200 of the prior art portable telephone terminal of FIG. 4.

The amplifying circuit of FIG. 3 is described below in detail.

In FIG. 3, a high frequency signal inputted through a signal input terminal 240 is provided through an impedance matching circuit 241 for performing impedance transformation, to a gain control circuit 242, whereby gain attenuation is performed on the high frequency input signal. The amount of attenuation in the gain control circuit 242 is controlled by the setting of the voltage value in a control terminal 243. The output signal of the gain control circuit 242 is provided to an amplifier 244, and thereby amplified. The output signal of the amplifier 244 is provided to a common terminal 245a of a high frequency switch 245.

The signal outputted from a terminal 245c of the high frequency switch 245 is provided through an impedance matching circuit 246 for performing impedance transformation, to an amplifier 247, and thereby amplified. The output signal of the amplifier 247 is provided through an impedance matching circuit 248 for performing impedance transformation, to a signal output terminal 249.

The signal outputted from a terminal 245b of the high frequency switch 245 is provided through an impedance matching circuit 250 for performing impedance transformation, to an amplifier 251, and thereby amplified. The output signal of the amplifier 251 is provided through an impedance matching circuit 252 for performing impedance transformation, to a signal output terminal 253.

A power supply terminal 254 is connected to a reference voltage terminal 242b of the gain control circuit 242, a power supply terminal of the amplifier 244, and a power supply terminal 245d of the high frequency switch 245. A power supply terminal 255 is connected to a control terminal 245e of the high frequency switch 245 and a power supply terminal of the amplifier 247. A power supply terminal 256 is connected to a power supply terminal of the amplifier 251.

Figure 10:
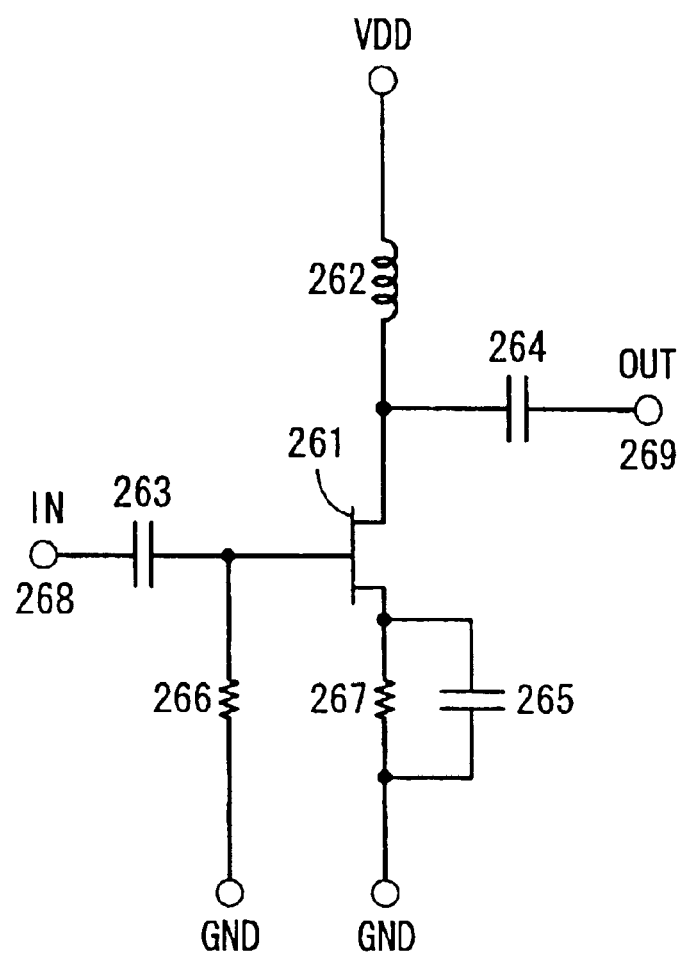
FIG. 10 is a circuit diagram showing an example of specific configuration of the amplifying circuit of FIG. 3.

Each of these amplifiers 244, 247, 251 is constructed, for example, from a field effect transistor 261, a coil 262, capacitors 263–265, and resistors 266 and 267 as shown in FIG. 10. The gate electrode is connected through the capacitor 263 to an input terminal 268. The drain electrode is connected through the capacitor 264 to an output terminal 269. The source electrode is grounded in the sense of high frequency.

Figure 11:
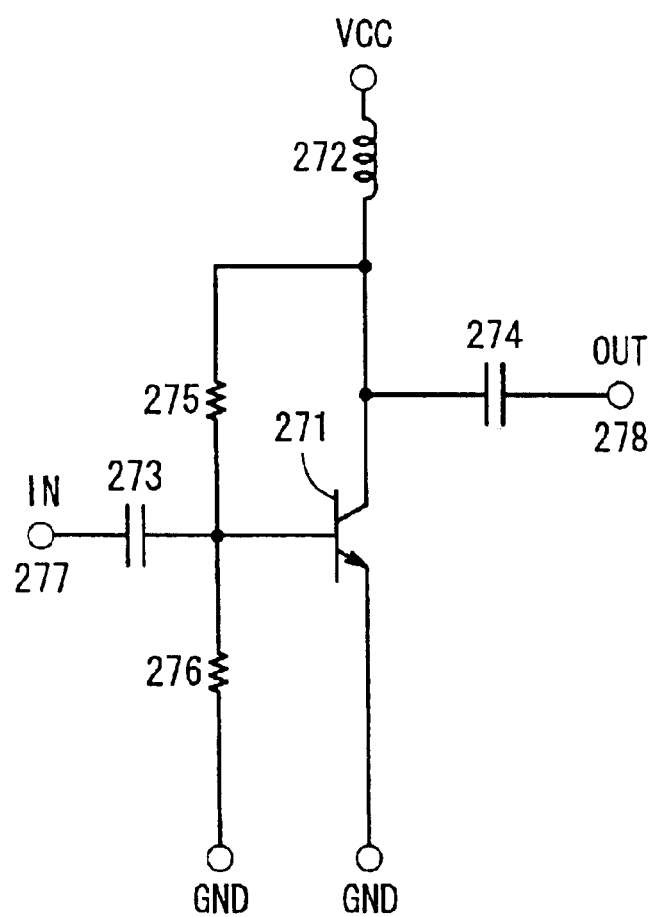
FIG. 11 is a circuit diagram showing another example of specific configuration of the amplifying circuit of FIG. 3.

In the amplifiers 244, 247, 251, bipolar transistors may be used in place of the field effect transistors. In this case, the collector electrode, the base electrode, and the emitter electrode of the bipolar transistor correspond respectively to the drain electrode, the gate electrode, and the source electrode of the field effect transistor. More specifically, such an amplifier is constructed, for example, from a bipolar transistor 271, a coil 272, capacitors 273 and 274, and resistors 275 and 276 as shown in FIG. 11. The base electrode is connected through the capacitor 273 to an input terminal 277. The collector electrode is connected through the capacitor 274 to an output terminal 278. The emitter electrode is grounded.

The operation of the amplifying circuit of FIG. 3 is described below in brief. The high frequency switch 245 is composed of the high frequency switch of FIG. 1. The terminals of the high frequency switch 245 correspond to these of the high frequency switch of FIG. 1 as follows. The common terminal 245a of the high frequency switch 245 corresponds to the signal input terminal 215. The terminal 245b corresponds to the signal output terminal 216. The terminal 245c corresponds to the signal output terminal 217. The power supply terminal 245d corresponds to the power supply terminal 211. The control terminal 245e corresponds to the control terminal 218.

As an example, considered below is the case that a voltage of 3 V is supplied to the power supply terminal 254, that a voltage of 3 V is supplied to the power supply terminal 255, and that the power supply terminal 256 is set at 0 V. In this case, the amplifier 244 is ON (active). The amplifier 247 is ON (active) The amplifier 251 is OFF (inactive). Further, in the high frequency switch 245, the common terminal 245a is in connection to the terminal 245c. At this time, a high frequency signal inputted through the signal input terminal 240 of the high frequency circuit of FIG. 3 is amplified by the amplifier 244 and the amplifier 247, and then outputted from the signal output terminal 249.

Considered next is the case that a voltage of 3 V is supplied to the power supply terminal 254, that the power supply terminal 255 is set at 0 V, and that a voltage of 3 V is supplied to the power supply terminal 256. In this case, the amplifier 244 is ON (active). The amplifier 247 is OFF (inactive). The amplifier 251 is ON (active). Further, in the high frequency switch 245, the common terminal 245a is in connection to the terminal 245b. At this time, a high frequency signal inputted through the signal input terminal 240 of the high frequency amplifier circuit is amplified by the amplifier 244 and the amplifier 251, and then outputted from the signal output terminal 253.

Thus, when the amplifier 247 and the amplifier 251 are arranged such as to correspond respectively to the specifications of PDC scheme and W-CDMA scheme, the operation current value can be set optimum for each specification.

Further, the control terminal 245e of the high frequency switch 245 and the power supply terminal 255 of the amplifier 247 are in common. This reduces the number of terminals. Further, the selection of the switch path and the selection of the amplifier are performed simultaneously. This simplifies the control of the high frequency amplifier circuit.

As described above, in the high frequency switch according to the embodiment of the invention, the switch is constructed from two field effect transistors 219 and 220, while two reference voltage terminals 213 and 214 each having a distinct voltage are provided in the reference voltage generation circuit. Then, the one reference voltage terminal 213 outputs a voltage which is equal to the middle value of the power supply voltage plus a half of the absolute value of the threshold value of the field effect transistors 219 and 220. This voltage is provided to the source electrode of the field effect transistor 220. The other reference voltage terminal 214 outputs a voltage which is equal to the middle value of the power supply voltage minus a half of the absolute value of the threshold value of the field effect transistors 219 and 220. This voltage is provided to the gate electrode of the field effect transistor 219. By virtue of this, the voltage ranges where the field effect transistors 219 and 220 are in the intermediate state between the ON and OFF states can completely overlap with each other. This expands the setting range of the control voltage for causing the field effect transistors 219 and 220 to be ON and OFF.

Further, in the amplifying circuit according to the embodiment of the invention, a high frequency switch is provided for selecting the first amplifier 247 and the second amplifier 248, whereby any one of the first and second amplifiers 247 and 248 is selected corresponding to the communication system used. This implements the amplifier circuit configuration corresponding to the specification of each communication system. This optimizes the amplifier circuit design, and hence reduces the operation current.

Further, the control voltage of the high frequency switch 245 and the power supply voltage of the amplifier 247 are in common. This reduces the number of terminals, and further simplifies the control of the amplifying circuit.

Further, the power supply voltage of the third amplifier 244 and the power supply voltage of the reference voltage generation circuit of the high frequency switch 245 are in common. This reduces the number of terminals.

What is claimed is:

1. A high frequency switch comprising:
   a signal input terminal;
   first and second signal output terminals;
   a control terminal to which a control voltage is applied;
   a switch provided with: (1) a first switch element having first and second signal electrodes and a first control electrode, said signal input terminal being connected to the first signal electrode, said first signal output terminal being connected to the second signal electrode, and said control terminal being connected to any one of the first and second signal electrodes, and (2) a second switch element having third and fourth signal electrodes and a second control electrode, said signal input terminal being connected to the third signal electrode, said second signal output terminal being connected to the fourth signal electrode, and said control terminal being connected to the second control electrode; and
   a reference voltage generation circuit that generates first and second reference voltages, the values of which are different from each other, provides said first reference voltage to the first control electrode, and provides said second reference voltage to any one of the third and fourth signal electrodes of said second switch element, wherein:
   on the basis of the relation between said control voltage and said first reference voltage and the relation between said control voltage and said second reference voltage, depending on the value of the control voltage, said first and second switch elements are selectively made conductive,
   said first switch element is composed of a first field effect transistor in which any one of the source electrode and the drain electrode serves as said first signal electrode, the other one of the source electrode and the drain electrode serves as said second signal electrode, and the gate electrode serves as said first control electrode,
   said second switch element is composed of a second field effect transistor in which any one of the source electrode and the drain electrode serves as said third signal electrode, the other one of the source electrode and the drain electrode serves as said fourth signal electrode, and the gate electrode serves as said second control electrode, and
   the difference between said first reference voltage and said second reference voltage equals approximately to the threshold value of said first and second field effect transistors.

2. A high frequency switch according to claim 1, wherein said second reference voltage is higher than said first reference voltage.

3. A high frequency switch according to claim 1, wherein said reference voltage generation circuit comprises a serial circuit of three or more resistors.

4. A high frequency switch according to claim 1, wherein:
   the gate electrode of said first field effect transistor and an output terminal of said reference voltage generation circuit are interconnected through a first resistor; and
   the gate electrode of said second field effect transistor and said control terminal are connected through a second resistor.

5. An amplifying circuit comprising:
   a signal input terminal;
   first and second signal output terminals;
   a control terminal to which a control voltage is applied;
   a switch provided with: (1) a first switch element having first and second signal electrodes and a first control electrode, said signal input terminal being connected to the first signal electrode and said control terminal being connected to any one of the first and second signal electrodes and (2) a second switch element having third and fourth signal electrodes and a second control electrode, said signal input terminal being connected to the third signal electrode and said control terminal being connected to the second control electrode;
   a first amplifier having an input terminal connected to the second signal electrode and an output terminal connected to said first signal output terminal;
   a second amplifier having an input terminal connected to the fourth signal electrode and an output terminal connected to said second signal output terminal; and
   a reference voltage generation circuit that generates first and second reference voltages, provides said first reference voltage to the first control electrode, and provides said second reference voltage to any one of the third and fourth signal electrodes of said second switch element, wherein:
   on the basis of the relation between said control voltage and said first reference voltage and the relation between said control voltage and said second reference voltage, depending on the value of the control voltage, said first and second switch elements are selectively made conductive,
   when said first switch element is conductive, said first amplifier is made active while said second amplifier is made inactive;
   when said second switch element is conductive, said first amplifier is made inactive while said second amplifier is made active,
   said first switch element is composed of a first field effect transistor in which any one of the source electrode and the drain electrode serves as said first signal electrode, the other one of the source electrode and the drain electrode serves as said second signal electrode, and the gate electrode serves as said first control electrode,
   said second switch element is composed of a second field effect transistor in which any one of the source electrode and the drain electrode serves as said third signal electrode, the other one of the source electrode and the drain electrode serves as said fourth signal electrode, and the gate electrode serves as said second control electrode,
   said first amplifier is composed of a third field effect transistor or a first bipolar transistor in which the gate electrode or the base electrode serves as the input terminal of the first amplifier, the drain electrode or the collector electrode serves as the output terminal of the first amplifier, and the source electrode or the emitter electrode is grounded in the sense of high frequency, and said second amplifier is composed of a fourth field effect transistor or a second bipolar transistor in which the gate electrode or the base electrode serves as the input terminal of the second amplifier, the drain electrode or the collector electrode serves as the output terminal of the second amplifier, and the source electrode or the emitter electrode is grounded in the sense of high frequency.

6. An amplifying circuit according to claim 5, wherein said second reference voltage is higher than said first reference voltage.

7. An amplifying circuit according to claim 5, wherein the difference between said first reference voltage and said second reference voltage equals approximately to the threshold value of said first and second field effect transistors.

8. An amplifying circuit according to claim 5, wherein said reference voltage generation circuit comprises a serial circuit of three or more resistors.

9. An amplifying circuit according to claim 5, wherein said control terminal and any one of the power supply terminals of said first and second amplifiers are connected in common.

10. An amplifying circuit according to claim 5, further comprising:
  a third amplifier an output terminal of which is connected to said signal input terminal, wherein:
  a signal inputted to an input terminal of said third amplifier is amplified and then provided to said signal input terminal, and
  a power supply terminal of said third amplifier is connected in common with a power supply terminal of said reference voltage generation circuit.

11. An amplifying circuit comprising:
  a signal input terminal;
  first and second signal output terminals;
  a control terminal to which a control voltage is applied;
  a switch provided with: (1) a first switch element having first and second signal electrodes and a first control electrode, said signal input terminal being connected to the first signal electrode, said first signal output terminal being connected to the second signal electrode, and said control terminal being connected to any one of the first and second signal electrodes and (2) a second switch element having third and fourth signal electrodes and a second control electrode, said signal input terminal being connected to the third signal electrode, said second signal output terminal being connected to the fourth signal electrode, and said control terminal being connected to the second control electrode;
  a reference voltage generation circuit for generating first and second reference voltages the values of which are different from each other, providing said first reference voltage to the first control electrode of said first switch element, and providing said second reference voltage to any one of the third and the fourth signal electrodes of said second switch element; and
  an amplifier an output terminal of which is connected to said signal input terminal; wherein:
  on the basis of the relation between said control voltage and said first reference voltage and the relation between said control voltage and said second reference voltage, depending on the value of the control voltage, said first and second switch elements are selectively made conductive,
  a signal inputted to an input terminal of said amplifier is amplified and then provided to said signal input terminal; and
  a power supply terminal of said amplifier is connected in common with a power supply terminal of said reference voltage generation circuit.

12. A mobile communication terminal comprising a high frequency switch having the function of selecting the path of a high frequency signal, said high frequency switch comprising:
  a signal input terminal;
  first and second signal output terminals;
  a control terminal to which a control voltage is applied;
  a switch provided with: (1) a first switch element having first and second signal electrodes and a first control electrode, said signal input terminal being connected to the first signal electrode, said first signal output terminal being connected to the second signal electrode, and said control terminal being connected to any one of the first and second signal electrodes and (2) a second switch element having third and fourth signal electrodes and a second control electrode, said signal input terminal being connected to the third signal electrode, said second signal output terminal being connected to the fourth signal electrode, and said control terminal being connected to the second control electrode; and
  a reference voltage generation circuit for generating first and second reference voltages the values of which are different from each other, providing said first reference voltage to the first control electrode of said first switch element, and providing said second reference voltage to any one of the third and fourth signal electrodes of said second switch element; wherein:
  on the basis of the relation between said control voltage and said first reference voltage and the relation between said control voltage and said second reference voltage, depending on the value of the control voltage, said first and second switch elements are selectively made conductive,
  said first switch element is composed of a first field effect transistor in which any one of the source electrode and the drain electrode serves as said first signal electrode, the other one of the source electrode and the drain electrode serves as said second signal electrode, and the gate electrode serves as said first control electrode,
  said second switch element is composed of a second field effect transistor in which any one of the source electrode and the drain electrode serves as said third signal electrode, the other one of the source electrode and the drain electrode serves as said fourth signal electrode, and the gate electrode serves as said second control electrode, and
  the difference between said first reference voltage and said second reference voltage equals approximately to the threshold value of said first and second field effect transistors.

13. A mobile communication terminal comprising an amplifying circuit having the function of selecting the path of a high frequency signal, said amplifying circuit comprising:
  a signal input terminal;

first and second signal output terminals;

a control terminal to which a control voltage is applied;

a switch provided with: (1) a first switch element having first and second signal electrodes and a first control electrode, said signal input terminal being connected to the first signal electrode, and said control terminal being connected to any one of the first and second signal electrodes and (2) a second switch element having third and fourth signal electrodes and a second control electrode, said signal input terminal being connected to the third signal electrode, and said control terminal being connected to the second control electrode;

a first amplifier having an input terminal connected to the second signal electrode of said first switch element and an output terminal connected to said first signal output terminal;

a second amplifier having an input terminal connected to the fourth signal electrode of said second switch element and an output terminal connected to said second signal output terminal; and a reference voltage generation circuit for generating first and second reference voltages, providing said first reference voltage to the first control electrode of said first switch element, and providing said second reference voltage to any one of the third and fourth signal electrodes of said second switch element; wherein:

on the basis of the relation between said control voltage and said first reference voltage and the relation between said control voltage and said second reference voltage, depending on the value of the control voltage, said first and second switch elements are selectively made conductive, when said first switch element is conductive, said first amplifier is made active while said second amplifier is made inactive; and when said second switch element is conductive, said first amplifier is made inactive while said second amplifier is made active, said first switch element is composed of a first field effect transistor in which any one of the source electrode and the drain electrode serves as said first signal electrode, the other one of the source electrode and the drain electrode serves as said second signal electrode, and the gate electrode serves as said first control electrode, said second switch element is composed of a second field effect transistor in which any one of the source electrode and the drain electrode serves as said third signal electrode, the other one of the source electrode and the drain electrode serves as said fourth signal electrode, and the gate electrode serves as said second control electrode, said first amplifier is composed of a third field effect transistor or a first bipolar transistor in which the gate electrode or the base electrode serves as the input terminal of the first amplifier, the drain electrode or the collector electrode serves as the output terminal of the first amplifier, and the source electrode or the emitter electrode is grounded in the sense of high frequency, and said second amplifier is composed of a fourth field effect transistor or a second bipolar transistor in which the gate electrode or the base electrode serves as the input terminal of the second amplifier, the drain electrode or the collector electrode serves as the output terminal of the second amplifier, and the source electrode or the emitter electrode is grounded in the sense of high frequency.

14. A mobile communication terminal comprising an amplifying circuit having the function of selecting the path of a high frequency signal, said amplifying circuit comprising:

a signal input terminal;

first and second signal output terminals;

a control terminal to which a control voltage is applied;

a switch provided with: (1) a first switch element having first and second signal electrodes and a first control electrode, said signal input terminal being connected to the first signal electrode, said first signal output terminal being connected to the second signal electrode, and said control terminal being connected to any one of the first and second signal electrodes and (2) a second switch element having third and fourth signal electrodes and a second control electrode, said signal input terminal being connected to the third signal electrode, said second signal output terminal being connected to the fourth signal electrode, and said control terminal being connected to the second control electrode;

a reference voltage generation circuit for generating first and second reference voltages the values of which are different from each other, providing said first reference voltage to the first control electrode of said first switch element, and providing said second reference voltage to any one of the third and fourth signal electrodes of said second switch element; and an amplifier an output terminal of which is connected to said signal input terminal; wherein:

on the basis of the relation between said control voltage and said first reference voltage and the relation between said control voltage and said second reference voltage, depending on the value of the control voltage, said first and second switch elements are selectively made conductive, a signal inputted to an input terminal of said amplifier is amplified and then provided to said signal input terminal; and a power supply terminal of said amplifier is connected in common with a power supply terminal of said reference voltage generation circuit.

* * * * *